US011736079B2

(12) United States Patent
Koh et al.

(10) Patent No.: US 11,736,079 B2
(45) Date of Patent: Aug. 22, 2023

(54) AMPLIFIER CIRCUIT AND DISPLAY APPARATUS INCLUDING THE SAME

(71) Applicants: Samsung Display Co., Ltd., Yongin-Si (KR); Korea Advanced Institute of Science and Technology, Daejeon (KR)

(72) Inventors: Seok-Tae Koh, Daejeon (KR); Seongjoo Lee, Suwon-si (KR); Hyun-Sik Kim, Daejeon (KR); Gyeong-Gu Kang, Daejeon (KR); Seunghwa Shin, Daejeon (KR); Ohjo Kwon, Suwon-si (KR); Keumdong Jung, Seoul (KR)

(73) Assignees: SAMSUNG DISPLAY CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/567,512

(22) Filed: Jan. 3, 2022

(65) Prior Publication Data

US 2022/0311397 A1    Sep. 29, 2022

(30) Foreign Application Priority Data

Mar. 26, 2021  (KR) .......................... 10-2021-0039946

(51) Int. Cl.
*H03F 3/45* (2006.01)
*H03F 1/02* (2006.01)
*G09G 3/20* (2006.01)

(52) U.S. Cl.
CPC .......... *H03F 3/45273* (2013.01); *G09G 3/20* (2013.01); *H03F 1/0211* (2013.01);
(Continued)

(58) Field of Classification Search
CPC ............ G09G 3/20; G09G 2310/0267; G09G 2310/0275; G09G 2310/0291;
(Continued)

(56) References Cited

U.S. PATENT DOCUMENTS 10,170,992 B1 *  1/2019  Omole ................ H03F 3/45475
2014/0253534 A1 *  9/2014  Kim ..................... G09G 3/3688
345/99

FOREIGN PATENT DOCUMENTS

KR       101388221 B1      4/2014

OTHER PUBLICATIONS

Yan, et al., Nested-Current-Mirror Rail-to-Rail-Output Single-Stage Amplifier With Enhancements of DC Gain, GBW and Slew Rate, IEEE Journal of Solid-State Circuits, vol. 50, No. 10, Oct. 2015, pp. 2353-2366.

* cited by examiner

*Primary Examiner* — Gerald Johnson
(74) *Attorney, Agent, or Firm* — Cantor Colburn LLP

(57) ABSTRACT

An amplifier circuit includes a differential input terminal, a first power supplier, an amplifier, and a current redistributor. A differential input terminal includes a first differential pair of a p-type and a second differential pair of an n-type, and receives an input voltage. A first power supplier supplies a bias current to the differential input terminal. An amplifier receives an output current of the first differential pair and an output current of the second differential pair, and applies an amplified current to an output node. A current redistributor receives the output current of the first differential pair and the output current of the second differential pair, and provides a redistribution current to the differential input terminal.

20 Claims, 10 Drawing Sheets

(52) U.S. Cl.
CPC . *H03F 3/45269* (2013.01); *G09G 2310/0267* (2013.01); *G09G 2310/0275* (2013.01); *G09G 2310/0291* (2013.01); *G09G 2330/02* (2013.01); *H03F 2203/45476* (2013.01)

(58) Field of Classification Search
CPC .............. G09G 2330/02; H03F 3/4521; H03F 3/45273; H03F 3/45269; H03F 2203/45476; H03F 2203/45524
See application file for complete search history.

AMPLIFIER CIRCUIT AND DISPLAY APPARATUS INCLUDING THE SAME

This application claims priority to Korean Patent Application No. 10-2021-0039946, filed on Mar. 26, 2021, and all the benefits accruing therefrom under 35 U.S.C. § 119, the content of which in its entirety is herein incorporated by reference.

BACKGROUND

1. Field

Embodiments of the invention relate to an amplifier circuit and a display apparatus including the amplifier circuit. More particularly, embodiments of the invention relate to an amplifier circuit included in a data driver and enhancing a transconductance in all input voltage ranges and a display apparatus including the amplifier circuit.

2. Description of the Related Art

Generally, a display apparatus includes a display panel and a display panel driver. The display panel includes a plurality of gate lines, a plurality of data lines and a plurality of pixels. The display panel driver includes a gate driver, a data driver and a driving controller. The gate driver outputs gate signals to the gate lines. The data driver outputs data voltages to the data lines. The driving controller controls the gate driver and the data driver.

The data driver may include an amplifier circuit for outputting the data voltages.

SUMMARY

In a conventional amplifier circuit using only one type of an input terminal, the amplifier circuit is turned off in a predetermined input voltage range, and thus, the amplifier circuit may not perform a desired operation in all input voltage ranges.

Embodiments of the invention provide an amplifier circuit using a nested-current-mirror ("NCM") structure to enhance a transconductance.

Embodiments of the invention also provide a display apparatus including the amplifier circuit.

In an embodiment of an amplifier circuit according to the invention, the amplifier circuit includes a differential input terminal which includes a first differential pair of a p-type and a second differential pair of an n-type, and receives an input voltage. The amplifier circuit includes a first power supplier which supplies a bias current to the differential input terminal. The amplifier circuit includes an amplifier which receives an output current of the first differential pair and an output current of the second differential pair, and applies an amplified current to an output node. The amplifier circuit includes a current redistributor which receives the output current of the first differential pair and the output current of the second differential pair, and provides a redistribution current to the differential input terminal.

In an embodiment, the first differential pair may provide the output current of the first differential pair to a first node. The second differential pair may provide the output current of the second differential pair to a second node. The amplifier may include a first current mirror circuit which multiplies the output current of the first differential pair by K where K is a positive real number, and provides a current generated by multiplying the output current of the first differential pair by K to the first node, a second current mirror circuit which provides the output current of the second differential pair to the first node, a third current mirror circuit which transmits a current provided to the first node to the output node, a fourth current mirror circuit which multiplies the output current of the second differential pair by K and provides a current generated by multiplying the output current of the first differential pair by K to the second node, a fifth current mirror circuit which provides the output current of the first differential pair to the second node, and a sixth current mirror circuit which transmits a current provided to the second node to the output node.

In an embodiment, the differential input terminal may further include a third differential pair, and a fourth differential pair. The amplifier may further include a seventh current mirror circuit which multiplies an output current of the third differential pair by K1 where K1 is a positive real number, and transmits a current generated by multiplying the output current of the third differential pair by K1 to a first node, and an eighth current mirror circuit which multiplies an output current of the fourth differential pair by K1 and transmits a current generated by multiplying the output current of the third differential pair by K1 to a second node.

In an embodiment, the current redistributor may include a current provider which provides the redistribution current to the first differential pair and the second differential pair, based on the output current of the first differential pair and the output current of the second differential pair. The current redistributor may include a second power supplier which supplies a bias voltage to the current provider.

In an embodiment, the current redistributor may include a ninth current mirror circuit which provides a first switch current to a third node based on the output current of the first differential pair. The current redistributor may include a tenth current mirror circuit which provides the redistribution current to the first differential pair. The current redistributor may include a first switching element which includes a control electrode which receives the bias voltage, an output electrode connected to an input electrode of the tenth current mirror circuit, and an input electrode connected to the third node. The current redistributor may include an eleventh current mirror circuit which provides a second switch current to the third node, based on the output current of the second differential pair. The current redistributor may include a twelfth current mirror circuit which provides the redistribution current to the second differential pair. The current redistributor may include a second switching element which includes a control electrode which receives the bias voltage, an output electrode connected to an input electrode of the twelfth current mirror circuit, and an input electrode connected to the third node. The tenth current mirror circuit may provide the redistribution current to the first differential pair, based on a first supply current which flows through the second switching element. The twelfth current mirror circuit may provide the redistribution current to the second differential pair, based on a second supply current which flows through the second switching element.

In an embodiment, the current redistributor may provide the redistribution current to the first differential pair and may not provide the redistribution current to the second differential pair in a first mode. The current redistributor may provide the redistribution current to the second differential pair and may not provide the redistribution current to the first differential pair in a second mode. The current redistributor provide the redistribution current to the first differential pair and the second differential pair in a third mode.

In an embodiment, the first differential pair and the first switching element may be turned on in the first mode. The second differential pair and the second switching element may be turned off in the first mode. The second differential pair and the second switching element may be turned on in the second mode. The first differential pair and the first switching element may be turned off in the second mode. The first differential pair and the second differential pair may be turned on in the third mode. The first switching element and the second switching element may be turned off in the third mode.

In an embodiment, the input voltage in the first mode may be less than the input voltage in the third voltage. The input voltage in the third mode may be less than the input voltage in the second mode.

In an embodiment, the bias voltage may be less than twice a threshold voltage of the first switching element, and less than twice a threshold voltage of the second switching element.

In an embodiment, the amplifier circuit further includes a common source amplifier connected to the output node of the amplifier.

In an embodiment of a display apparatus according to the invention, a display apparatus includes a display panel which displays an image, a gate driver which provides a gate signal to the display panel, a data driver including an amplifier circuit which outputs a data voltage to the display panel and a driving controller which provides a first control signal to the gate driver, and provides a second control signal and a data signal to the data driver. The amplifier circuit includes a differential input terminal which includes a first differential pair of a p-type and a second differential pair of an n-type, and receives an input voltage, a first power supplier which supplies a bias current to the differential input terminal, an amplifier which receives an output current of the first differential pair and an output current of the second differential pair and applies an amplified current to an output node, and a current redistributor which receives the output current of the first differential pair and the output current of the second differential pair, and provides a redistribution current to the differential input terminal.

In an embodiment, the first differential pair may provide the output current of the first differential pair to a first node. The second differential pair may provide the output current of the second differential pair to a second node. The amplifier may include a first current mirror circuit which multiplies the output current of the first differential pair by K where K is a positive real number, and provides a current generated by multiplying the output current of the first differential pair by K to the first node, a second current mirror circuit which provides the output current of the second differential pair to the first node, a third current mirror circuit which transmits a current provided to the first node to the output node, a fourth current mirror circuit which multiplies the output current of the second differential pair by K and provides a current generated by multiplying the output current of the first differential pair by K to the second node, a fifth current mirror circuit which provides the output current of the first differential pair to the second node, and a sixth current mirror circuit which transmits a current provided to the second node to the output node.

In an embodiment, the differential input terminal may further include a third differential pair, and a fourth differential pair. The amplifier may further include a seventh current mirror circuit which multiplies an output current of the third differential pair by K1 where K1 is a positive real number, and transmits a current generated by multiplying the output current of the third differential pair by K1 to a first node, and an eighth current mirror circuit which multiplies an output current of the fourth differential pair by K1 and transmits a current generated by multiplying the output current of the third differential pair by K1 to a second node.

In an embodiment, the current redistributor may include a current provider which provides the redistribution current to the first differential pair and the second differential pair, based on the output current of the first differential pair and the output current of the second differential pair. The current redistributor may include a second power supplier which supplies a bias voltage to the current provider.

In an embodiment, the current redistributor may include a ninth current mirror circuit which provides a first switch current to a third node based on the output current of the first differential pair. The current redistributor may include a tenth current mirror circuit which provides the redistribution current to the first differential pair. The current redistributor may include a first switching element which includes a control electrode which receives the bias voltage, an output electrode connected to an input electrode of the tenth current mirror circuit, and an input electrode connected to the third node. The current redistributor may include an eleventh current mirror circuit which provides a second switch current to the third node, based on the output current of the second differential pair. The current redistributor may include a twelfth current mirror circuit which provides the redistribution current to the second differential pair. The current redistributor may include a second switching element which includes a control electrode which receives the bias voltage, an output electrode connected to an input electrode of the twelfth current mirror circuit, and an input electrode connected to the third node. The tenth current mirror circuit may provide the redistribution current to the first differential pair, based on a first supply current which flows through the second switching element. The twelfth current mirror circuit may provide the redistribution current to the second differential pair, based on a second supply current which flows through the second switching element.

In an embodiment, the current redistributor may provide the redistribution current to the first differential pair and may not provide the redistribution current to the second differential pair in a first mode. The current redistributor may provide the redistribution current to the second differential pair and may not provide the redistribution current to the first differential pair in a second mode. The current redistributor provide the redistribution current to the first differential pair and the second differential pair in a third mode.

In an embodiment, the first differential pair and the first switching element may be turned on in the first mode. The second differential pair and the second switching element may be turned off in the first mode. The second differential pair and the second switching element may be turned on in the second mode. The first differential pair and the first switching element may be turned off in the second mode. The first differential pair and the second differential pair may be turned on in the third mode. The first switching element and the second switching element may be turned off in the third mode.

In an embodiment, the input voltage in the first mode may be less than the input voltage in the third voltage. The input voltage in the third mode may be less than the input voltage in the second mode.

In an embodiment, the bias voltage may be less than twice a threshold voltage of the first switching element, and less than twice a threshold voltage of the second switching element.

In an embodiment, the display apparatus may further include a common source amplifier connected to the output node of the amplifier.

According to the amplifier circuit and the display apparatus including the amplifier circuit, the amplifier circuit may prevent all input terminals from being turned off in all input voltage ranges, and supplies current when one input terminal is turned off. Thus, a transconductance may be enhanced in all input voltage ranges.

BRIEF DESCRIPTION OF THE DRAWINGS

The above and other features and advantages of the invention will become more apparent by describing in detailed embodiments thereof with reference to the accompanying drawings, in which.

DETAILED DESCRIPTION

Figure 1:
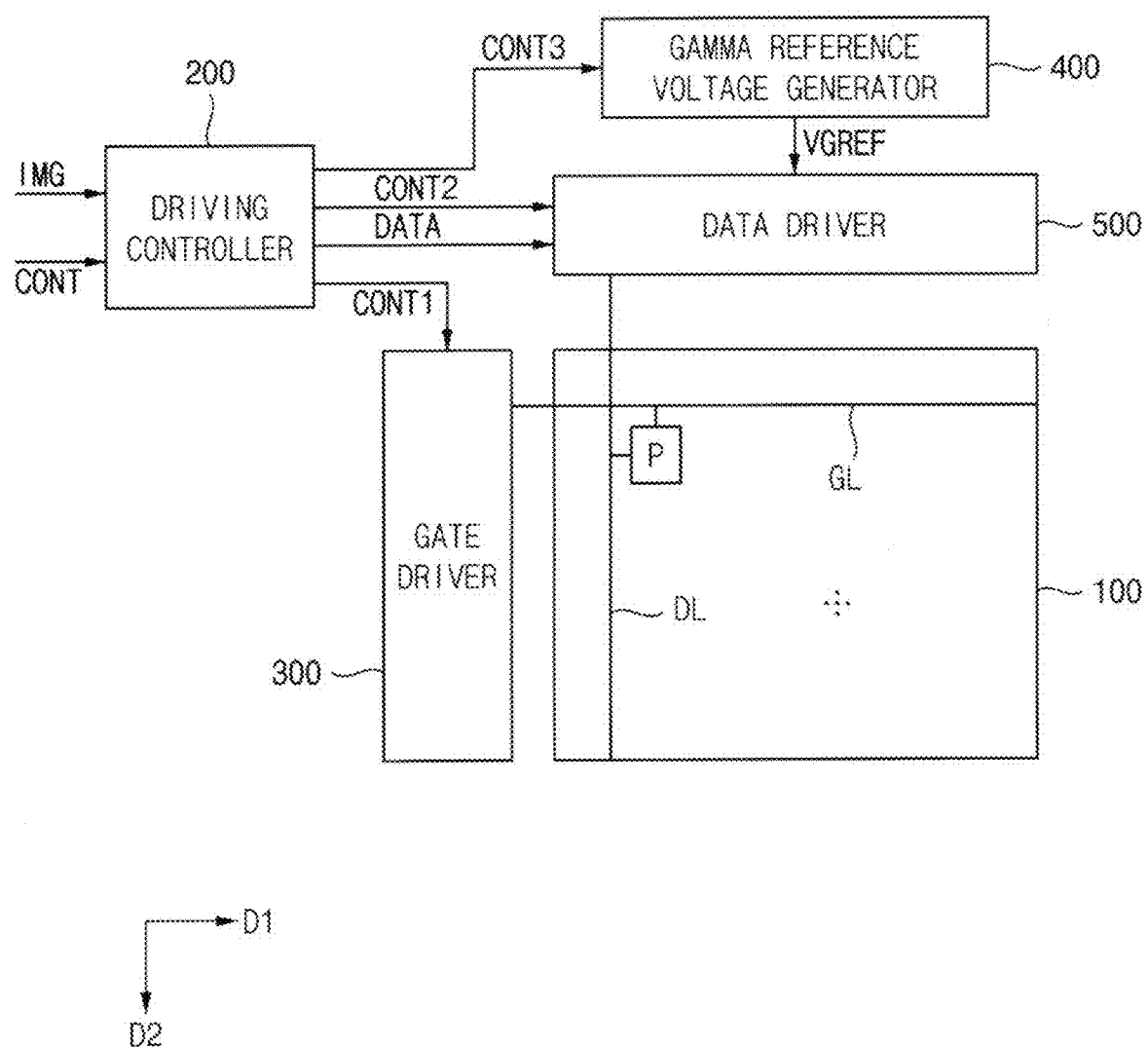
FIG. 1 is a block diagram illustrating an embodiment of a display apparatus according to the invention.

Hereinafter, the invention will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating an embodiment of a display apparatus according to the invention;

Referring to FIG. 1, the display apparatus includes a display panel 100 and a display panel driver. The display panel driver includes a driving controller 200, a gate driver 300, a gamma reference voltage generator 400 and a data driver 500.

In an embodiment, the driving controller 200 and the data driver 500 may be integrally formed or unitary. In an embodiment, the driving controller 200, the gamma reference voltage generator 400 and the data driver 500 may be integrally formed or unitary, for example. A driving module including at least the driving controller 200 and the data driver 500 which are integrally formed or unitary may be referred to as to a timing controller embedded data driver ("TED").

The display panel 100 has a display region on which an image is displayed and a peripheral region adjacent to the display region.

The display panel 100 includes a plurality of gate lines GL, a plurality of data lines DL and a plurality of pixels electrically connected to the gate lines GL and the data lines DL. The gate lines GL extend in a first direction D1 and the data lines DL extend in a second direction D2 crossing the first direction D1.

The driving controller 200 receives input image data IMG and an input control signal CONT from an external apparatus. In an embodiment, the input image data IMG may include red image data, green image data and blue image data, for example. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. In an embodiment, the gate driver 300 may sequentially output the gate signals to the gate lines GL, for example. In an embodiment, the gate driver 300 may be disposed (e.g., mounted) on the peripheral region of the display panel 100, for example. In an embodiment, the gate driver 300 may be integrated on the peripheral region of the display panel 100, for example.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
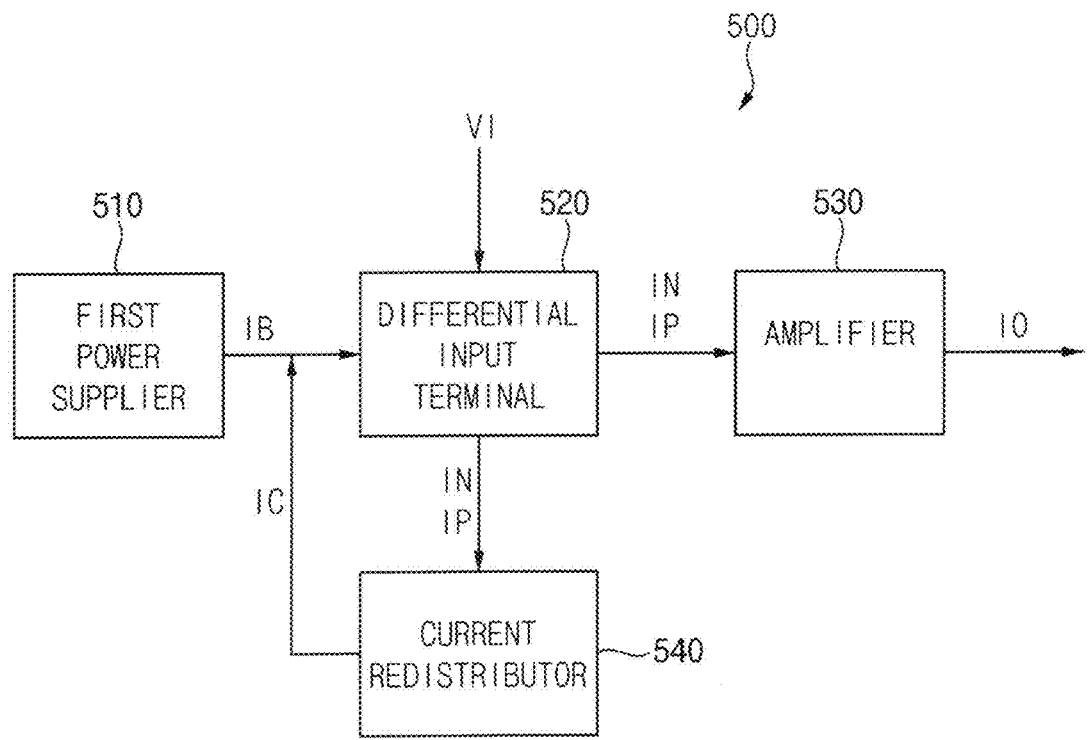
FIG. 2 is a block diagram illustrating an amplifier circuit of a data driver of FIG. 1.
Figure 3:
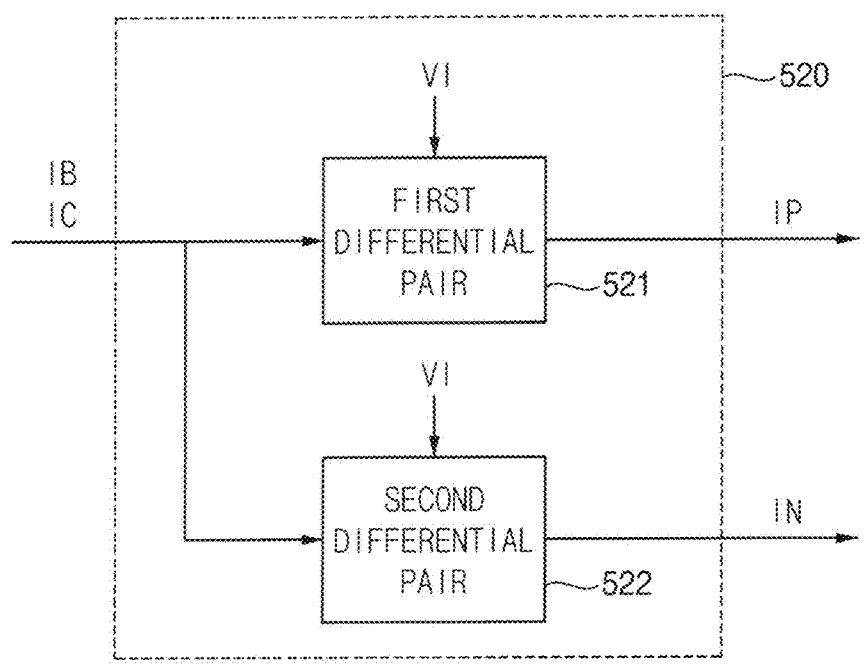
FIG. 3 is a block diagram illustrating a differential input terminal of FIG. 2.

FIG. 2 is a block diagram illustrating an amplifier circuit of a data driver 500 of FIG. 1. FIG. 3 is a block diagram illustrating a differential input terminal 520 of FIG. 2.

Referring to FIGS. 2 and 3, the data driver 500 includes a first power supplier 510, a differential input terminal 520, an amplifier 530, and a current redistributor 540.

The first power supplier 510 may supply a bias current IB to the differential input terminal 520.

The differential input terminal 520 may include a first differential pair 521 and a second differential pair 522. An input voltage VI may be applied to the differential input terminal 520. The differential input terminal 520 may receive the bias current IB from the first power supplier 510. The differential input terminal 520 may receive a redistribution current IC from the current redistributor 540. The differential input terminal 520 may output an output current IP of the first differential pair 521, and an output current IN of the second differential pair 522 to the amplifier 530 and the current redistributor 540.

The current redistributor 540 may receive the output current IP of the first differential pair 521, and the output current IN of the second differential pair 522 from the differential input terminal 520. The current redistributor 540 may provide the redistribution current IC to the differential input terminal 520 based on a mode which is determined by the output current IP of the first differential pair 521, and the output current IN of the second differential pair 522.

The amplifier 530 may receive the output current IP of the first differential pair 521, and the output current IN of the second differential pair 522. The amplifier 530 may output an amplified current IO to an output node based on the output current IP of the first differential pair 521, and the output current IN of the second differential pair 522.

Figure 4:
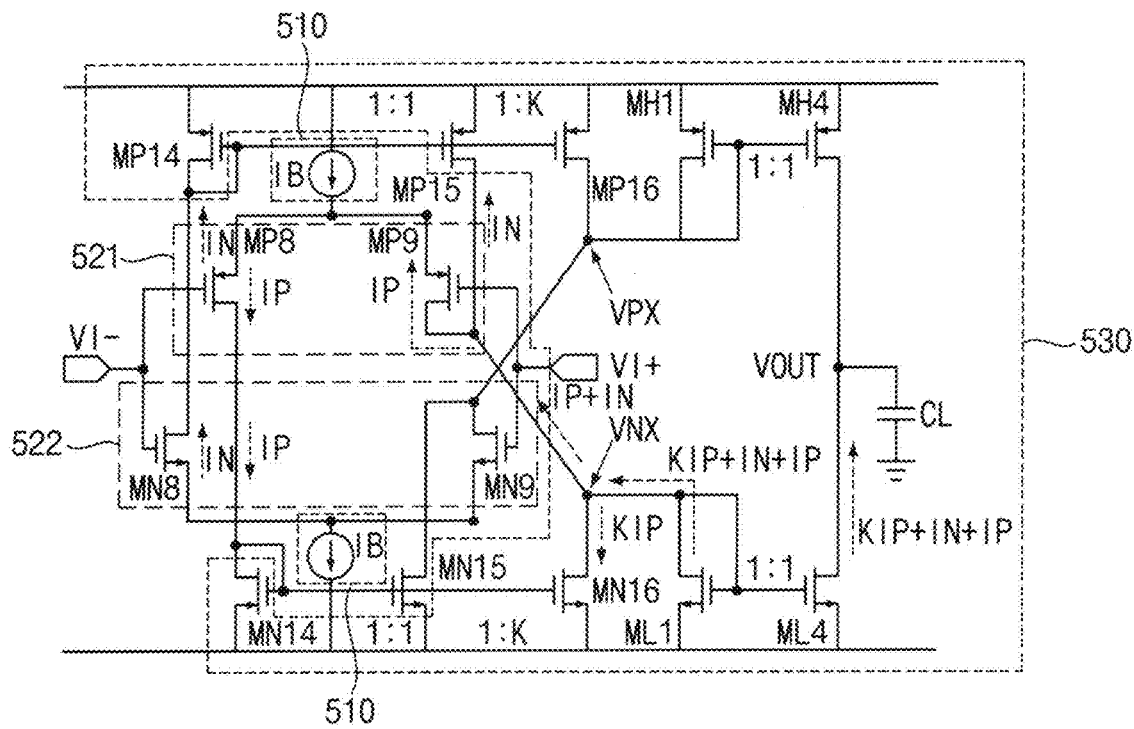
FIG. 4 is a circuit diagram illustrating an amplified current flowing to an output node from a perspective of a first node.
Figure 5:
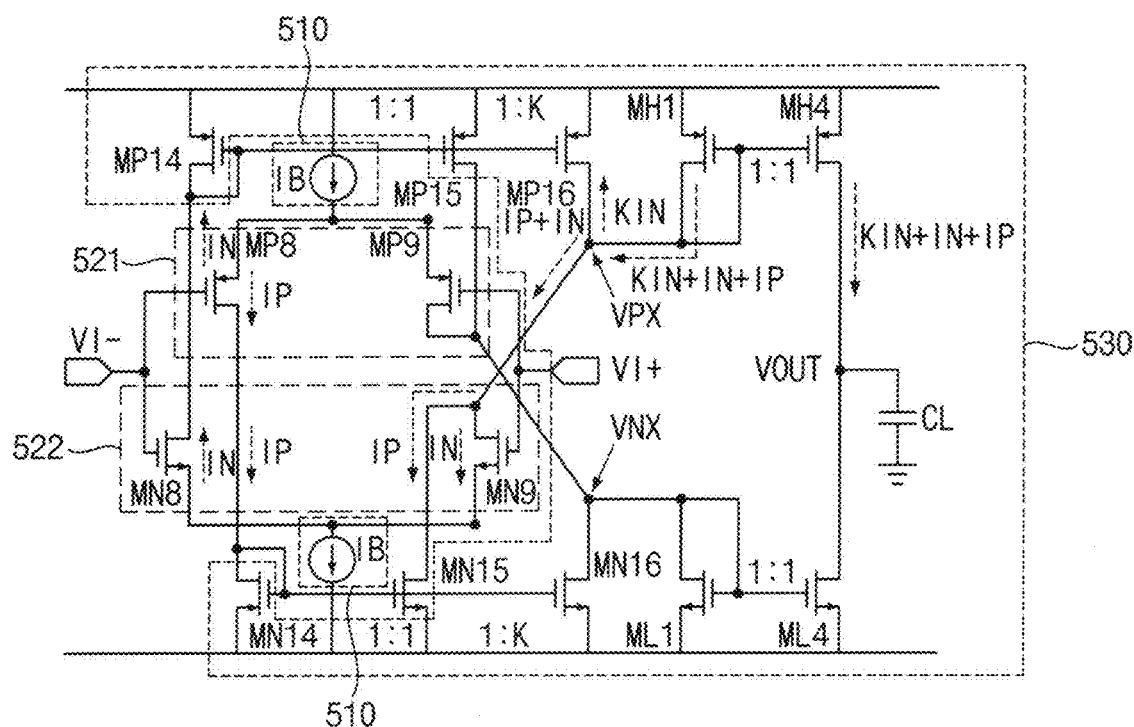
FIG. 5 is a circuit diagram illustrating an amplified current flowing to the output node from a perspective of a second node.

FIG. 4 is a circuit diagram illustrating an amplified current flowing to the output node VOUT from a perspective of a first node VNX. FIG. 5 is a circuit diagram illustrating an amplified current flowing to the output node VOUT from a perspective of a second node VPX.

Referring to FIGS. 4 and 5, the first differential pair MP8 and MP9 may include p-type thin film transistors ("TFTs"). The second differential pair MN8 and MN9 may include n-type TFTs.

The first power supplier 510 may supply the bias current IB to the first differential pair MP8 and MP9 and the second differential pair MN8 and MN9.

The data driver 500 may include an output capacitor CL which is connected to the output node VOUT.

The amplifier 530 may include a first current mirror circuit MN14 and MN16, a second current mirror circuit MP14 and MP15, a third current mirror circuit ML1 and ML4, a fourth current mirror circuit MP14 and MP16, a fifth current mirror circuit MN14 and MN15, and a sixth current mirror circuit MH1 and MH4.

The first differential pair MP8 and MP9 and the second differential pair MN8 and MN9 may not be simultaneously turned off. In an embodiment, an input voltage VI− may be applied to transistors MP8 and MN8, and an input voltage VI+ may be applied to transistors MP9 and MN9. In an embodiment, when the first differential pair MP8 and MP9 includes a pair of p-type TFTs and the second differential pair MN8 and MN9 includes a pair of n-type TFTs, at least one of the first differential pair MP8 and MP9 and the second differential pair MN8 and MN9 may be turned on although the input voltage VI− or VI+ is very high or very low, for example. However, this is only an example and the invention may include all methods which may achieve similar effects.

Referring to FIG. 4, the first differential pair MP8 and MP9 may provide the output current IP of the first differential pair to the first node VNX. The first current mirror circuit MN14 and MN16 may multiply the output current IP of the first differential pair by K (K is a positive real number), and may provide the current generated by multiplying the output current IP of the first differential pair by K to the first node VNX. The second current mirror circuit MP14 and MP15 may provide the output current IN of the second differential pair to the first node VNX. The third current mirror circuit ML1 and ML4 may transmit the current provided to the first node VNX to the output node VOUT.

A gate electrode of an input transistor MN14 of the first current mirror circuit may be connected to a gate electrode of an output transistor MN16 of the first current mirror circuit. The gate electrode of the input transistor MN14 of the first current mirror circuit may be connected to a drain electrode of the input transistor MN14 of the first current mirror circuit. The drain electrode of the input transistor MN14 of the first current mirror circuit may be connected to the first differential pair MP8 and MP9. A drain electrode of the output transistor MN16 of the first current mirror circuit may be connected to the first node VNX. A drain current of the output transistor MN16 of the first current mirror circuit may be K times of a drain current of the input transistor MN14 of the first current mirror circuit.

A gate electrode of an input transistor MP14 of the second current mirror circuit may be connected to a gate electrode of an output transistor MP15 of the second current mirror circuit. The gate electrode of the input transistor MP14 of the second current mirror circuit may be connected to a drain electrode of the input transistor MP14 of the second current mirror circuit. The drain electrode of the input transistor MP14 of the second current mirror circuit may be connected to the second differential pair MN8 and MN9. A drain electrode of an output transistor MP15 of the second current mirror circuit may be connected to the first node VNX. A drain current of the input transistor MP14 of the second current mirror circuit and a drain current of the output transistor MP15 of the second current mirror circuit may be substantially the same.

A gate electrode of an input transistor ML1 of the third current mirror circuit may be connected to a gate electrode of an output transistor ML4 of the third current mirror circuit. The gate electrode of the input transistor ML1 of the third current mirror circuit may be connected to a drain electrode of the input transistor ML1 of the third current mirror circuit. The drain electrode of the input transistor ML1 of the third current mirror circuit may be connected to the first node VNX. A drain electrode of the output transistor ML4 of the third current mirror circuit may be connected to the output node VOUT. A drain current of the input transistor ML1 of the third current mirror circuit and a drain current of the output transistor ML4 of the third current mirror circuit may be substantially the same.

Referring to FIG. 5, the second differential pair MN8 and MN9 may provide the output current IN of the second differential pair to the second node VPX. The fourth current mirror circuit MP14 and MP16 may multiply the output current IN of the second differential pair by K, and may provide the current generated by multiplying the output current IN of the second differential pair by K to the second node VPX. The fifth current mirror circuit MN14 and MN15 may provide the output current IP of the first differential pair to the second node VPX. The sixth current mirror circuit MH1 and MH4 may transmit the current provided to the second node VPX to the output node VOUT.

A gate electrode of an input transistor MP14 of the fourth current mirror circuit may be connected to a gate electrode of an output transistor MP16 of the fourth current mirror circuit. The gate electrode of the input transistor MP14 of the fourth current mirror circuit may be connected to a drain electrode of the input transistor MP14 of the fourth current mirror circuit. The drain electrode of the input transistor MP14 of the fourth current mirror circuit may be connected to the second differential pair MN8 and MN9. A drain electrode of the output transistor MP16 of the fourth current mirror circuit may be connected to the second node VPX. A drain current of the output transistor MP16 of the fourth current mirror circuit may be K times of a drain current of the input transistor MP14 of the fourth current mirror circuit.

A gate electrode of an input transistor MN14 of the fifth current mirror circuit may be connected to a gate electrode of an output transistor MN15 of the fifth current mirror circuit. The gate electrode of the input transistor MN14 of the fifth current mirror circuit MN14 may be connected to a drain electrode of the input transistor MN14 of the fifth current mirror circuit. The drain electrode of the input transistor MN14 of the fifth current mirror circuit may be connected to the first differential pair MP8 and MP9. A drain electrode of the output transistor MN15 of the fifth current mirror circuit may be connected to the second node VPX. A drain current of the input transistor MN14 of the fifth current mirror circuit and a drain current of the output transistor MN15 of the fifth current mirror circuit may be substantially the same.

A gate electrode of the input transistor MH1 of the sixth current mirror circuit may be connected to a gate electrode of the output transistor MH4 of the sixth current mirror circuit. The gate electrode of the input transistor MH1 of the sixth current mirror circuit may be connected to a drain electrode of the input transistor MH1 of the sixth current mirror circuit. The drain electrode of the input transistor MH1 of the sixth current mirror circuit may be connected to the second node VPX. A drain electrode of the output transistor MH4 of the sixth current mirror circuit may be connected to the output node VOUT. A drain current of the input transistor MH1 of the sixth current mirror circuit and a drain current of the output transistor MH4 of the sixth current mirror circuit may be substantially the same.

Referring to FIGS. 4 and 5, the output current IP of the first differential pair, the output current IN of the second differential pair, and an output current KIP of the first differential pair generated by multiplying the output current IP of the first differential pair by K may be transmitted to the output node VOUT from a perspective of the first node VNX. The output current IP of the first differential pair, the output current IN of the second differential pair, and the output current KIN of the second differential pair generated by multiplying the output current IN of the second differential pair by K may be transmitted to the output node VOUT from a perspective of the second node VPX. Accordingly, a transconductance of an entire circuit may be enhanced.

Figure 6:
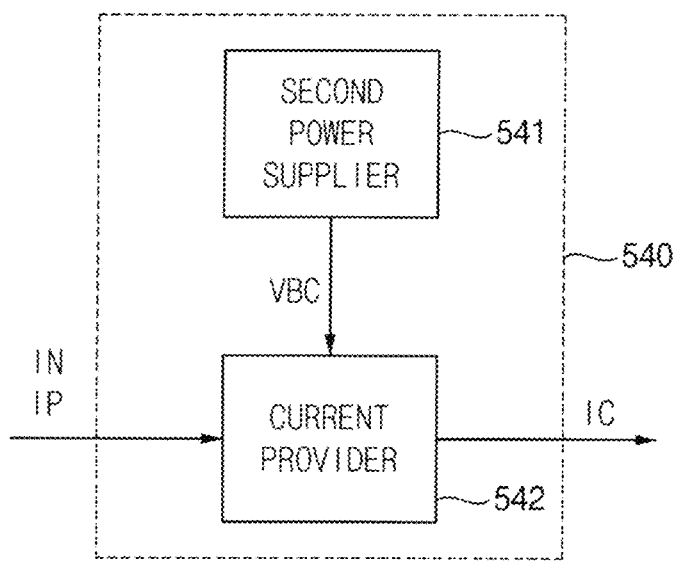
FIG. 6 is a block diagram illustrating a current redistributor of FIG. 2.

FIG. 6 is a block diagram illustrating the current redistributor 540 of FIG. 2.

Referring to FIG. 6 the current redistributor 540 includes a second power supplier 541 and a current provider 542.

The second power supplier 541 may supply a bias voltage VBC to the current provider 542.

The current provider 542 may receive the output current IP of the first differential pair and the output current IN of the second differential pair. The current provider 542 may provide the redistribution current IC to the differential input terminal 520 (refer to FIGS. 2 and 3), based on the output current IP of the first differential pair and the output current IN of the second differential pair.

Figure 7:
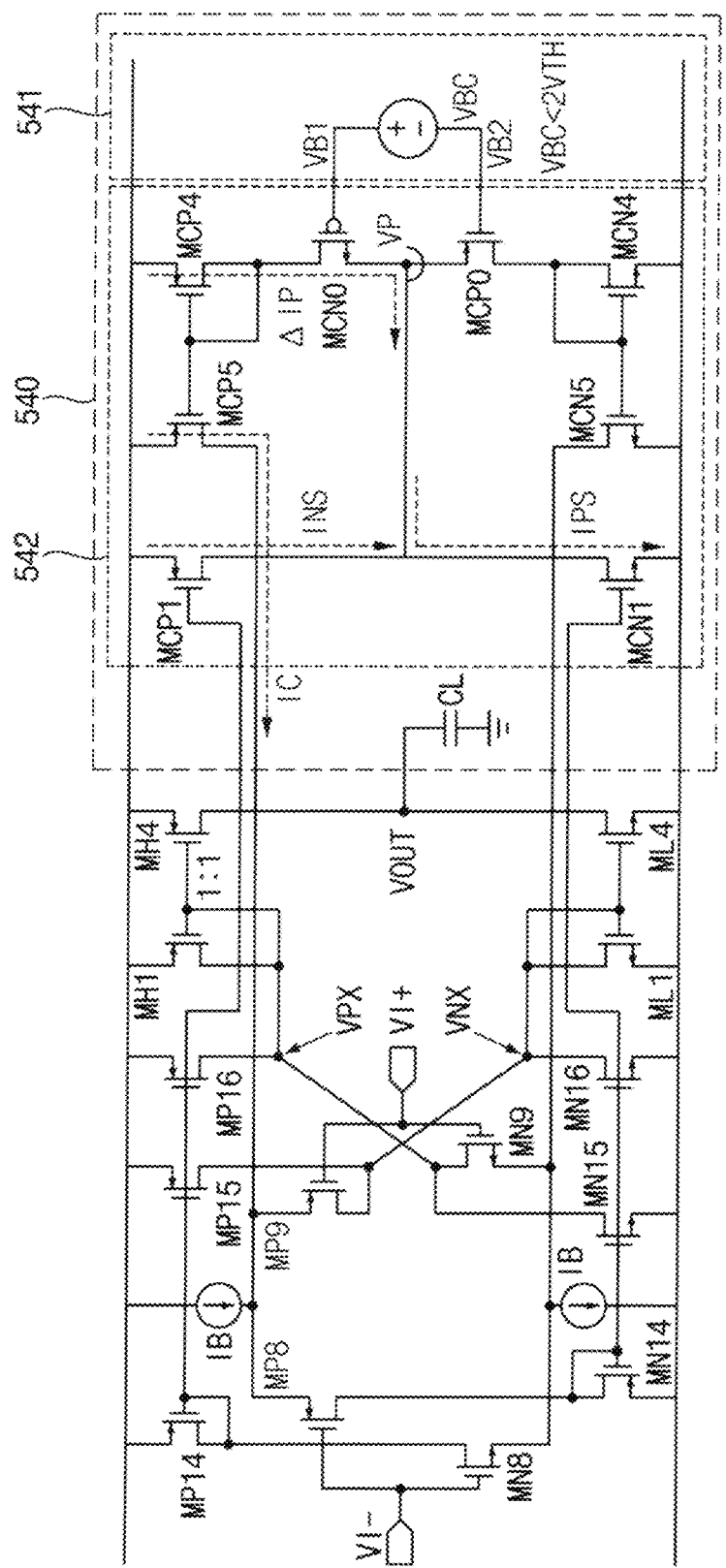
FIG. 7 is a circuit diagram illustrating an operation of the current redistributor in a first mode.
Figure 8:
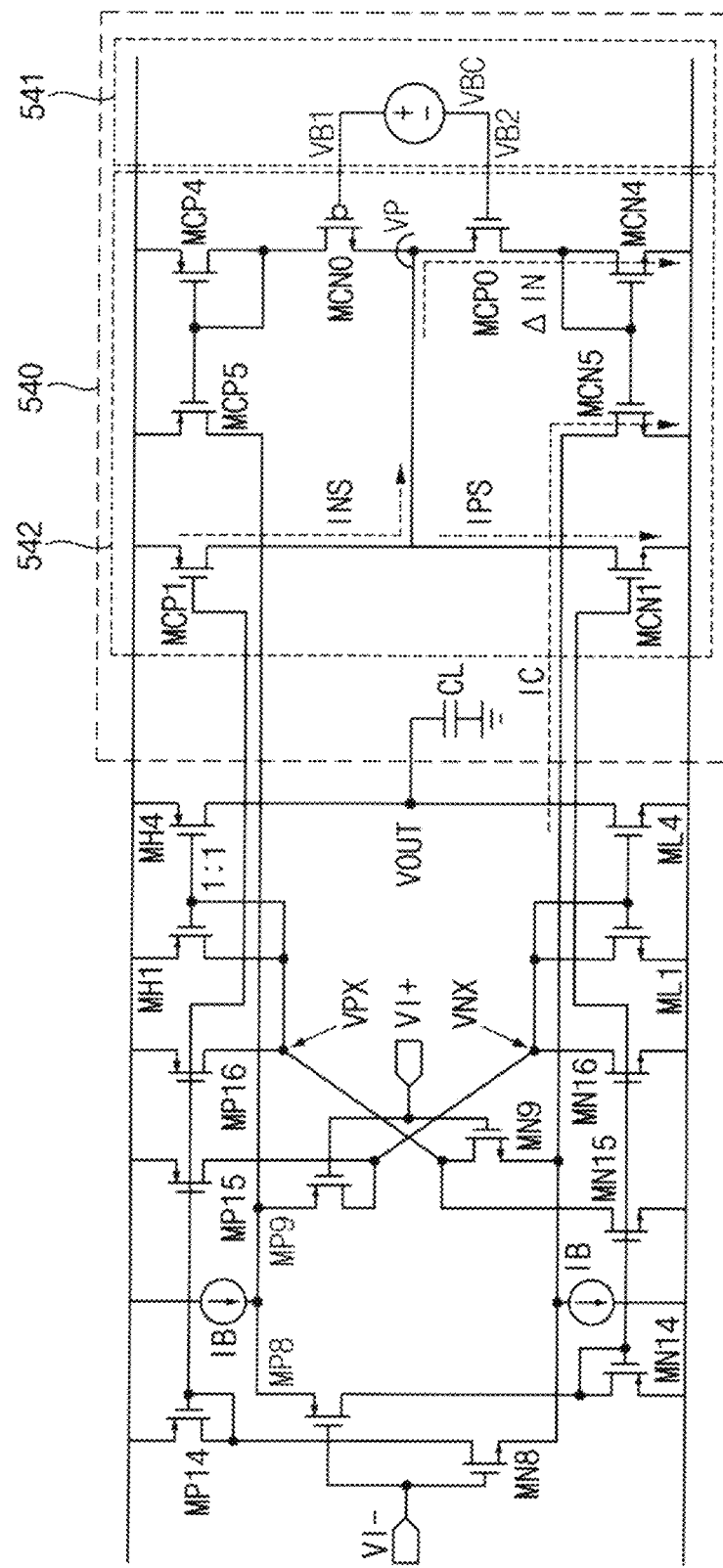
FIG. 8 is a circuit diagram illustrating an operation of the current redistributor in a second mode.
Figure 9:
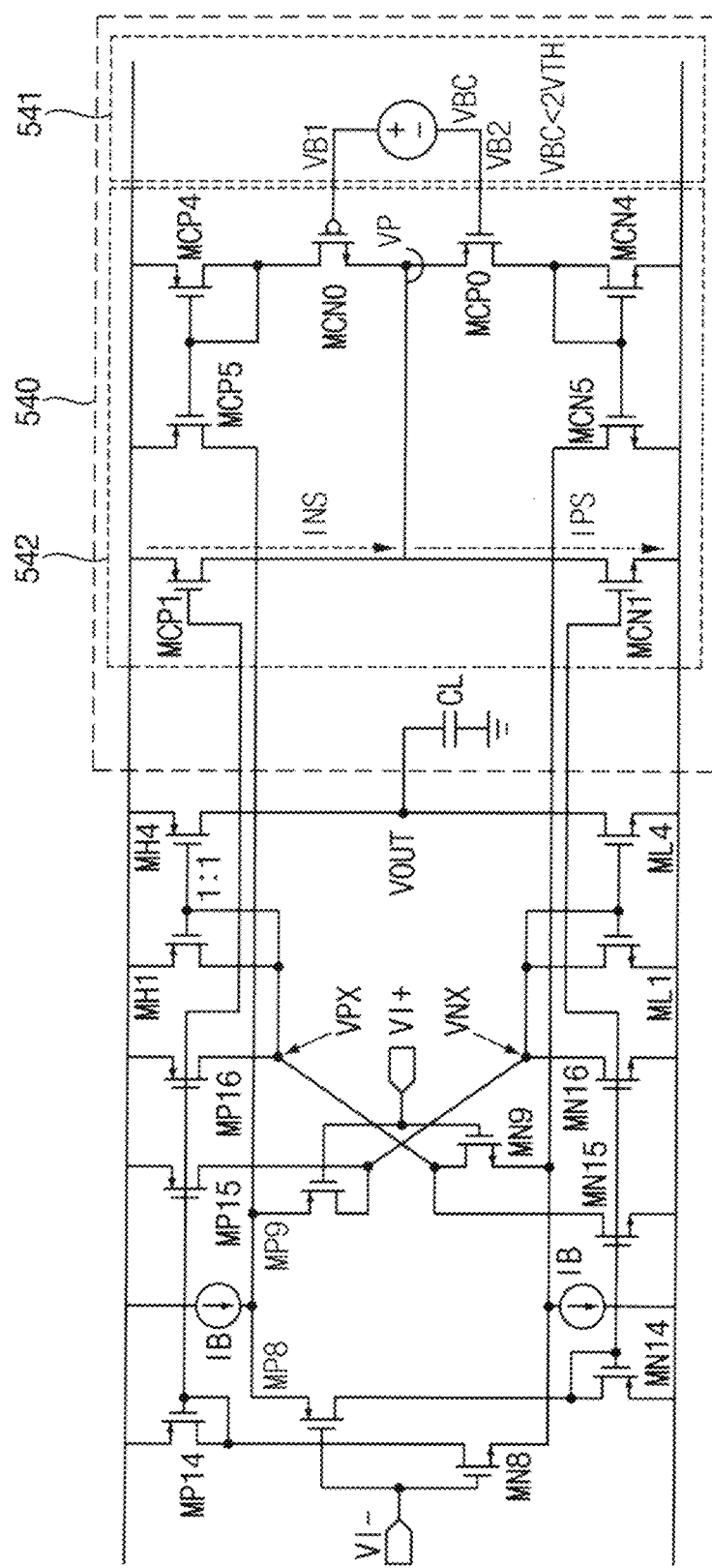
FIG. 9 is a circuit diagram illustrating an operation of the current redistributor in a third mode.

FIG. 7 is a circuit diagram illustrating an operation of the current redistributor 540 in a first mode. FIG. 8 is a circuit diagram illustrating an operation of the current redistributor 540 in a second mode. FIG. 9 is a circuit diagram illustrating an operation of the current redistributor 540 in a third mode.

Referring to FIGS. 7 to 9, a first switching element MCN0 may be an n-type TFT, and a second switching element MCP0 may be a p-type TFT.

A ninth current mirror circuit MN14 and MCN1 may provide a first switch current IPS to a third node VP, based on the output current IP of the first differential pair. A tenth current mirror circuit MCP4 and MCP5 may provide the redistribution current IC to the first differential pair MP8 and MP9. An eleventh current mirror circuit MP14 and MCP1 may provide a second switch current INS to the third node VP, based on the output current IN of the second differential pair. A twelfth current mirror circuit MCN4 and MCN5 may provide the redistribution current IC to the second differential pair MN8 and MN9.

The first switching element MCN0 may include a control electrode receiving a first voltage VB1 of the bias voltage VBC having a first polarity, an output electrode connected to an input electrode (e.g., a drain electrode of MCP4) of the tenth current mirror circuit, and an input electrode connected to the third node VP. The second switching element MCP0 may include a control electrode receiving a second voltage VB2 of the bias voltage VBC having a second polarity opposite to the first polarity, an output electrode connected to an input electrode (e.g., a drain electrode of MCN4) of the twelfth current mirror circuit, and an input electrode connected to the third node VP.

The tenth current mirror circuit MCP4 and MCP5 may provide the redistribution current IC to the first differential pair MP8 and MP9, based on a first supply current ΔIP flowing through the first switching element MCN0. The twelfth current mirror circuit MCN4 and MCN5 may provide the redistribution current IC to the second differential pair MN8 and MN9, based on a second supply current ΔIN flowing through the second switching element MCP0.

A gate electrode of an input transistor MN14 of the ninth current mirror circuit may be connected to a gate electrode of an output transistor MCN1 of the ninth current mirror circuit. The gate electrode of the input transistor MN14 of the ninth current mirror circuit may be connected to a drain electrode of the input transistor MN14 of the ninth current mirror circuit. The drain electrode of the input transistor MN14 of the ninth current mirror circuit may be connected to the first differential pair MP8 and MP9. A drain electrode of the output transistor MCN1 of the ninth current mirror circuit may be connected to the third node VP.

A gate electrode of an input transistor MCP4 of the tenth current mirror circuit may be connected to a gate electrode of an output transistor MCP5 of the tenth current mirror circuit. A gate electrode of the input transistor MCP4 of the tenth current mirror circuit may be connected to a drain electrode of the input transistor MCP4 of the tenth current mirror circuit. The drain electrode of the input transistor MCP4 of the tenth current mirror circuit may be connected to a drain electrode of the first switching element MCN0. A drain electrode of the output transistor MCP5 of the tenth current mirror circuit may be connected to the first differential pair MP8 and MP9.

A gate electrode of an input transistor MP14 of the eleventh current mirror circuit may be connected to a gate electrode of an output transistor MCP1 of the eleventh current mirror circuit. A gate electrode of the input transistor MP14 of the eleventh current mirror circuit may be connected to a drain electrode of the input transistor MP14 of the eleventh current mirror circuit. A drain electrode of the input transistor MP14 of the eleventh current mirror circuit may be connected to the second differential pair MN8 and MN9. A drain electrode of the output transistor MCP1 of the eleventh current mirror circuit may be connected to the third node VP.

A gate electrode of an input transistor MCN4 of the twelfth current mirror circuit may be connected to a gate electrode of an output transistor MCN5 of the twelfth current mirror circuit. The gate electrode of the input transistor MCN4 of the twelfth current mirror circuit may be connected to a drain electrode of the input transistor MCN4 of the twelfth current mirror circuit. A drain electrode of the output transistor MCN5 of the twelfth current mirror circuit may be connected to the second differential pair MN8 and MN9.

Referring to FIG. 7, the current redistributor 540 may provide the redistribution current IC to the first differential pair MP8 and MP9 and may not provide the redistribution current IC to the second differential pair MN8 and MN9 in the first mode. The first differential pair MP8 and MP9 and the first switching element MCN0 may be turned on in the first mode. The second differential pair MN8 and MN9 and the second switching element MCP0 are turned off in the first mode.

In the first mode, as the first differential pair MP8 and MP9 is turned on and the second differential pair MN8 and MN9 is turned off, the output current IP of the first differential pair may be transmitted to the third node VP through the ninth current mirror circuit MN14 and MCN1. Accordingly, the first switch current ΔIP may be increased. The first switch current ΔIP may be significantly greater than the second switch current ΔIN. So, the voltage of the third node VP may be reduced. Due to the voltage reduction, the first switching element MCN0 may be turned on. As a result, the tenth current mirror circuit MCP4 and MCP5 may supply the redistribution current IC to the first differential pair MP8 and MP9.

Referring to FIG. 8, the current redistributor 540 may provide the redistribution current IC to the second differential pair MN8 and MN9 and may not provide the redistribution current IC to the first differential pair MP8 and MP9 in the second mode. The second differential pair MN8 and MN9 and the second switching element MCP0 may be turned on in the second mode. The first differential pair MP8 and MP9 and the first switching element MCN0 are turned off in the second mode.

In the second mode, as the first differential pair MP8 and MP9 is turned off and the second differential pair MN8 and MN9 is turned on, the output current IN of the second differential pair may be transmitted to the third node VP through the eleventh current mirror circuit MP14 and MCP1. Accordingly, the second switch current ΔIN may be increased. The first switch current ΔIP may be significantly less than the second switch current ΔIN. So, the voltage of the third node VP may be increased. Due to the voltage increase, the second switching element MCP0 may be turned on. As a result, the twelfth current mirror circuit MCN4 and MCN5 may supply the redistribution current IC to the second differential pair MN8 and MN9.

Referring to FIG. 9, the current redistributor 540 may not provide the redistribution current IC to the first differential pair MP8 and MP9 and second differential pair MN8 and MN9 in the third mode. The first differential pair MP8 and MP9 and the second differential pair MN8 and MN9 may be turned on in the third mode. The first switching element MCN0 and the second switching element MCP0 are turned off in the third mode.

In the third mode, as the first differential pair MP8 and MP9 and the second differential pair MN8 and MN9 are turned on, the output current IP of the first differential pair may be transmitted to the third node VP through the ninth current mirror circuit MN14 and MCN1. In addition, the output current IN of the second differential pair may be transmitted to the third node VP through the eleventh current mirror circuit MP14 and MCP1. Accordingly, a difference between the first switch current ΔIP and the second switch current ΔIN may be very little. Since the difference is very little, the first switching element MCN0 and the second switching element MCP0 may be turned off. As a result, the redistributing current IC may not be supplied to the first differential pair MP8 and MP9 and the second differential pair MN8 and MN9.

Referring to FIGS. 7 to 9, the input voltage VI+ of the first mode may be less than the input voltage VI+ of the third mode. And, the input voltage VI+ of the third mode may be less than the input voltage VI+ of the second mode.

The bias voltage VBC may be less than twice a threshold voltage VTH of the first switching element MCN0. In addition, the bias voltage VBC may be less than twice a threshold voltage VTH of the second switching element MCP0.

Therefore, when one of the first differential pair MP8 and MP9 and the second differential pair MN8 and MN9 is turned off, the transconductance may be maintained by supplying the redistribution current IC.

Figure 10:
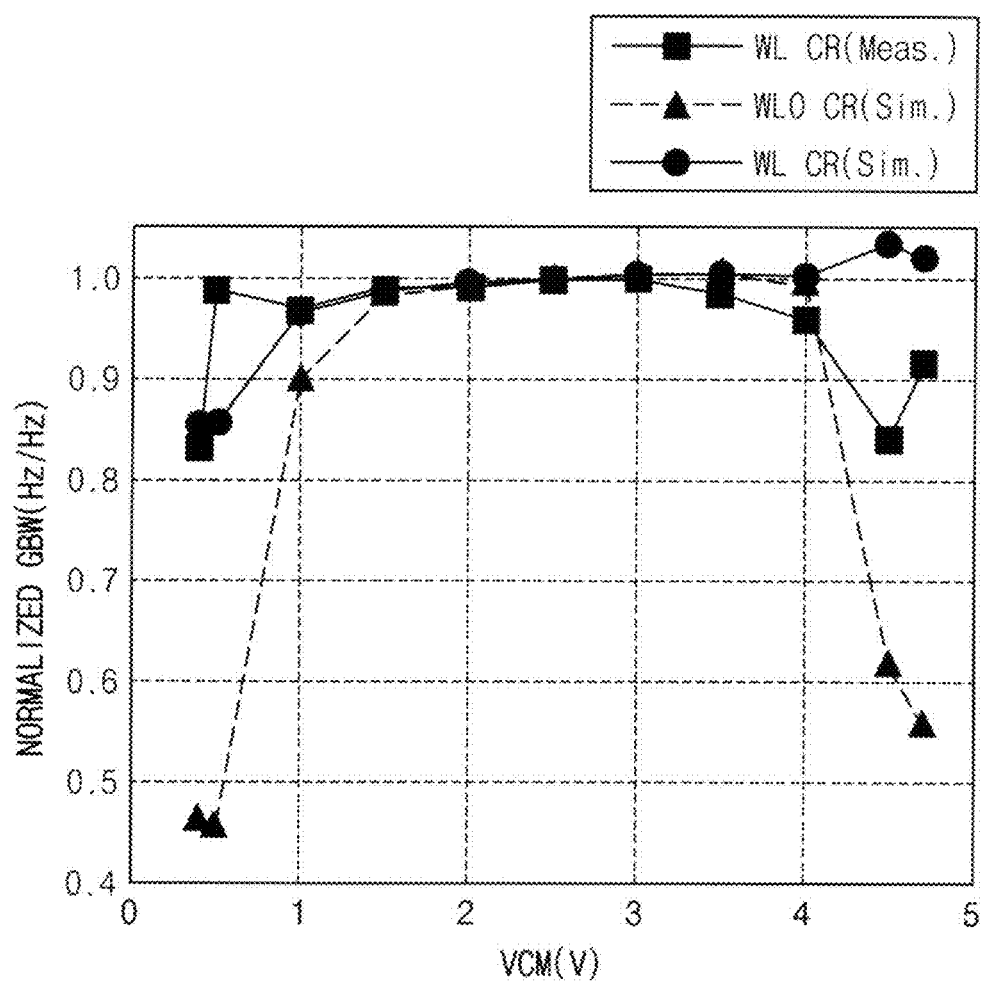
FIG. 10 is a graph illustrating a result of an embodiment according to the invention.

FIG. 10 is a graph illustrating a result of an embodiment according to the invention.

Referring to FIG. 10, when the current redistributor 540 presents, a graph (■) showing actual measured values of the normalized gain bandwidth ("GBW") values depending on a common mode input voltage VCM shows that the actual measured values of the normalized GBW values maintain above 0.8 in a range of all the common mode input voltage VCM.

When the current redistributor 540 presents, a graph (●) showing results of simulating the normalized GBW values depending on the common mode input voltage VCM shows that the results of simulating the normalized GBW values maintain above 0.8 in the range of all the common mode input voltage VCM.

When the current redistributor 540 does not present, a graph (▲) showing results of simulating the normalized GBW values according to the common mode input voltage VCM shows that the results of the normalized GBW values is less than 0.6 in a range in which the common mode voltage VCM is 0.5V or less, and 4.5V or more.

Therefore, by the presence of the current redistributor 540, the invention may enhance the GBW value in range of all input voltage VI.

Figure 11:
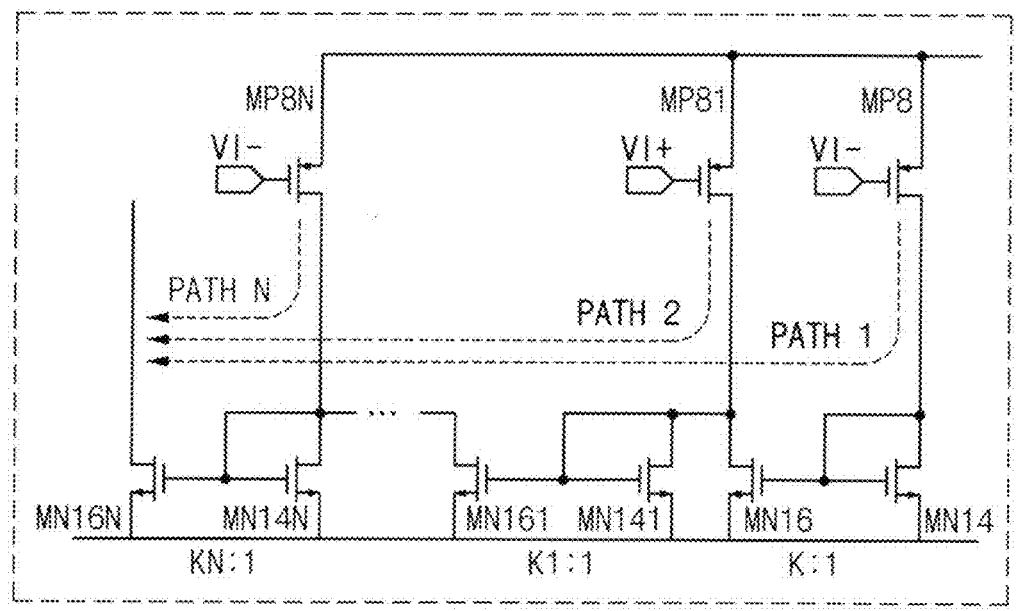
FIG. 11 is a circuit diagram illustrating an embodiment of one transistor of a third differential pair and a seventh current mirror circuit according to the invention.

FIG. 11 is a circuit diagram illustrating an embodiment of one transistor MP81 of a third differential pair and a seventh current mirror circuit MN141 and MN161 according to the invention.

Figure 12:
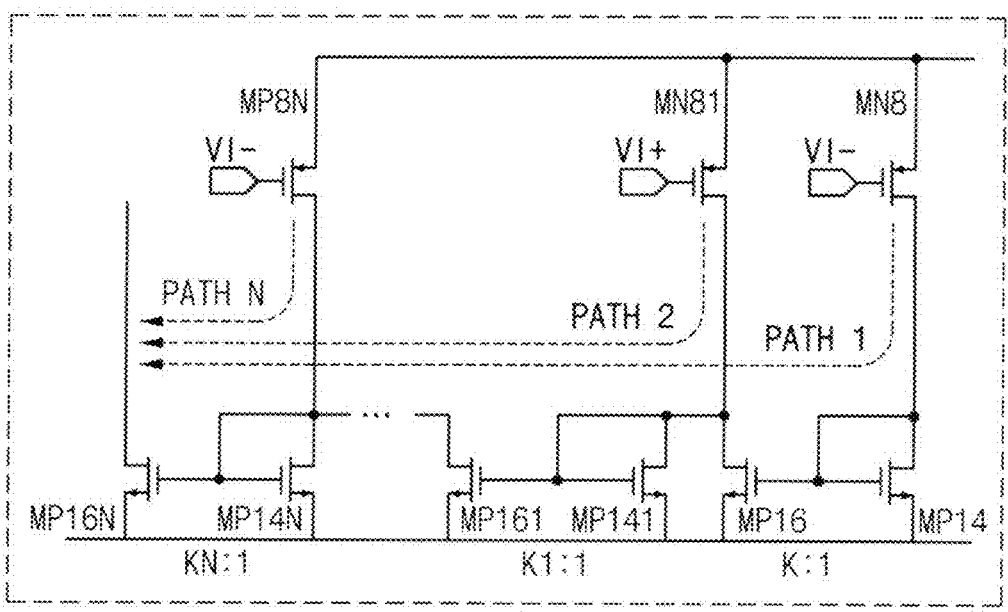
FIG. 12 is a circuit diagram illustrating an embodiment of one transistor of a fourth differential pair and an eighth current mirror circuit according to the invention.

FIG. 12 is a circuit diagram illustrating an embodiment of one transistor MN81 of a fourth differential pair and an eighth current mirror circuit MP141 and MP161 according to the invention.

Referring to FIG. 11, the third differential pair may include one transistor MP81 of the third differential pair and the other transistor which is symmetric with the one transistor MP81 of the third differential pair. The one transistor MP81 of the third differential pair may be connected in parallel with a part MP8 of the first differential pair.

A drain electrode of the seventh current mirror circuit MN141 and MN161 may be connected to the third differential pair. The seventh current mirror circuit MN141 and MN161 may multiply an output current of the third differential pair by K1 (K1 is a positive real number), and may transmit the current generated by multiplying the output current of the third differential pair by K1 to a first node VNX (refer to FIGS. 4, 5 and 7 to 9).

The differential input terminal 520 (refer to FIGS. 2 and 3) and the amplifier 530 (refer to FIG. 2) may be connected to a differential pair and a current mirror circuit in parallel. In an embodiment, the differential input terminal 520 may include MP8N, for example. In an embodiment, the amplifier 530 may include MN14N and MN16N, for example.

Referring to FIG. 12, a fourth differential pair may include one transistor MN81 of the fourth differential pair and the other transistor which is symmetric with the one transistor MN81 of the fourth differential pair. The one transistor MN81 of the fourth differential pair may be connected in parallel with a part MN8 of the second differential pair.

A drain electrode of the eighth current mirror circuit MP141 and MP161 may be connected to the fourth differential pair. The eighth current mirror circuit MP141 and MP161 may multiply an output current of the fourth differential pair by K1, and may transmit the current generated by multiplying the output current of the fourth differential pair by K1 to a second node VPX (refer to FIGS. 4, 5 and 7 to 9).

The differential input terminal 520 (refer to FIGS. 2 and 3) and the amplifier 530 (refer to FIG. 2) may be connected to a differential pair and a current mirror circuit in parallel. In an embodiment, the differential input terminal 520 may include MN8N, for example. In an embodiment, the amplifier 530 may include MP14N and MP16N, for example.

Figure 13:
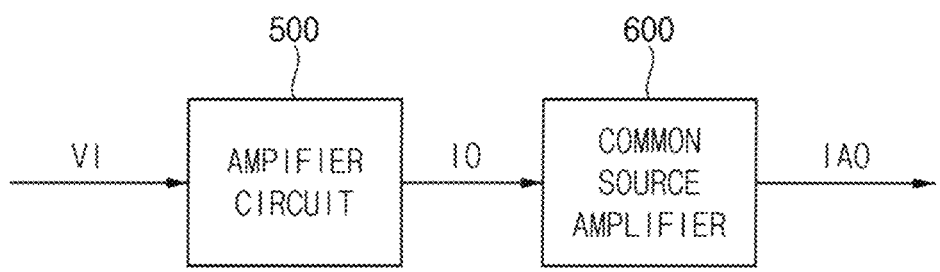
FIG. 13 is a block diagram illustrating an embodiment of an amplifier circuit which is connected to a common source amplifier according to the invention.

FIG. 13 is a block diagram illustrating an embodiment of an amplifier circuit 500 which is connected to a common source amplifier 600 according to the invention.

Referring to FIG. 13, the amplifier circuit 500 may receive the input voltage VI. The amplifier circuit 500 may output the amplified current IO, based on the input voltage VI. The common source amplifier 600 may receive the amplified current IO. The common source amplifier 600 may generate a common source output current IAO by amplification of the amplified current IO, and may output the common source output current IAO. Thus, as the invention increases the overall gain, the circuit of the invention may have a wider GBW.

According to the embodiment of the invention, the amplifier circuit 500 may include amplifier 530 so that the invention may enhance the transconductance. The differential input terminal 520 may include the first differential pair 521 including a p-type TFT and the second differential pair 522 including an n-type TFT so that the first differential pair 521 and the second differential pair 522 may not be simultaneously turned off in range of all the input voltage VI in the invention. The current redistributor 540 may maintain the transconductance in range of all the input voltage VI.

Therefore, the invention may enhance the transconductance in range of all the input voltage VI.

According to the invention as explained above, the invention may enhance the transconductance in range of all the input voltage.

The foregoing is illustrative of the invention and is not to be construed as limiting thereof. Although a few embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An amplifier circuit comprising:
a differential input terminal which includes a first differential pair of a p-type and a second differential pair of an n-type, and receives an input voltage;
a first power supplier which supplies a bias current to the differential input terminal;
an amplifier which receives an output current of the first differential pair and an output current of the second differential pair, and applies an amplified current to an output node; and
a current redistributor which receives the output current of the first differential pair and the output current of the second differential pair, and provides a redistribution current to the differential input terminal,
wherein only one of the first differential pair and the second differential pair can be turned off and the redistribution current is provided to the other one of the first differential pair and the second differential pair turned on to maintain a transconductance in all input voltage ranges of the input voltage.

2. The amplifier circuit of claim 1, wherein the first differential pair provides the output current of the first differential pair to a first node,
wherein the second differential pair provides the output current of the second differential pair to a second node,
wherein the amplifier comprises:
a first current mirror circuit which multiplies the output current of the first differential pair by K where K is a positive real number, and provides a current generated by multiplying the output current of the first differential pair by K to the first node;
a second current mirror circuit which provides the output current of the second differential pair to the first node;
a third current mirror circuit which transmits a current provided to the first node to the output node;
a fourth current mirror circuit which multiplies the output current of the second differential pair by K and provides a current generated by multiplying the output current of the second differential pair by K to the second node;
a fifth current mirror circuit which provides the output current of the first differential pair to the second node; and
a sixth current mirror circuit which transmits a current provided to the second node to the output node.

3. The amplifier circuit of claim 1, wherein the differential input terminal further comprises:
a third differential pair; and
a fourth differential pair,
wherein the amplifier further comprises:
a seventh current mirror circuit which multiplies an output current of the third differential pair by K1 where K1 is a positive real number, and transmits a current generated by multiplying the output current of the third differential pair by K1 to a first node; and
an eighth current mirror circuit which multiplies an output current of the fourth differential pair by K1 and transmits a current generated by multiplying the output current of the fourth differential pair by K1 to a second node.

4. The amplifier circuit of claim 1, wherein the current redistributor comprises:
a current provider which provides the redistribution current to the first differential pair and the second differential pair, based on the output current of the first differential pair and the output current of the second differential pair; and
a second power supplier which supplies a bias voltage to the current provider.

5. The amplifier circuit of claim 4, wherein the current redistributor further comprises:
a ninth current mirror circuit which provides a first switch current to a third node based on the output current of the first differential pair;
a tenth current mirror circuit which provides the redistribution current to the first differential pair;
a first switching element including a control electrode which receives the bias voltage, an output electrode connected to an input electrode of the tenth current mirror circuit, and an input electrode connected to the third node;
an eleventh current mirror circuit which provides a second switch current to the third node, based on the output current of the second differential pair;

a twelfth current mirror circuit which provides the redistribution current to the second differential pair; and
a second switching element including a control electrode which receives the bias voltage, an output electrode connected to an input electrode of the twelfth current mirror circuit, and an input electrode connected to the third node,
wherein the tenth current mirror circuit provides the redistribution current to the first differential pair, based on a first supply current which flows through the second switching element, and
wherein the twelfth current mirror circuit provides the redistribution current to the second differential pair, based on a second supply current which flows through the second switching element.

6. The amplifier circuit of claim 5, wherein the current redistributor provides the redistribution current to the first differential pair and does not provide the redistribution current to the second differential pair in a first mode,
wherein the current redistributor provides the redistribution current to the second differential pair and does not provide the redistribution current to the first differential pair in a second mode, and
wherein the current redistributor does not provide the redistribution current to the first differential pair and the second differential pair in a third mode.

7. The amplifier circuit of claim 6, wherein the first differential pair and the first switching element are turned on in the first mode,
wherein the second differential pair and the second switching element are turned off in the first mode,
wherein the second differential pair and the second switching element are turned on in the second mode,
wherein the first differential pair and the first switching element are turned off in the second mode,
wherein the first differential pair and the second differential pair are turned on in the third mode,
wherein the first switching element and the second switching element are turned off in the third mode.

8. The amplifier circuit of claim 7, wherein the input voltage in the first mode is less than the input voltage in the third mode,
wherein the input voltage in the third mode is less than the input voltage in the second mode.

9. The amplifier circuit of claim 5, wherein the bias voltage is less than twice a threshold voltage of the first switching element, and less than twice a threshold voltage of the second switching element.

10. The amplifier circuit of claim 1 further comprising:
a common source amplifier connected to the output node of the amplifier.

11. A display apparatus comprising:
a display panel which displays an image;
a gate driver which provides a gate signal to the display panel;
a data driver including an amplifier circuit which outputs a data voltage to the display panel, the amplifier circuit comprising:
a differential input terminal which includes a first differential pair of a p-type and a second differential pair of an n-type, and receives an input voltage;
a first power supplier which supplies a bias current to the differential input terminal;
an amplifier which receives an output current of the first differential pair and an output current of the second differential pair and applies an amplified current to an output node; and
a current redistributor which receives the output current of the first differential pair and the output current of the second differential pair, and provides a redistribution current to the differential input terminal; and
a driving controller which provides a first control signal to the gate driver, and provides a second control signal and a data signal to the data driver,
wherein only one of the first differential pair and the second differential pair can be turned off and the redistribution current is provided to the other one of the first differential pair and the second differential pair turned on to maintain a transconductance in all input voltage ranges of the input voltage.

12. The display apparatus of claim 11, wherein the first differential pair provides the output current of the first differential pair to a first node,
wherein the second differential pair provides the output current of the second differential pair to a second node,
wherein the amplifier comprises:
a first current mirror circuit which multiplies the output current of the first differential pair by K where K is a positive real number, and provides a current generated by multiplying the output current of the first differential pair by K to the first node;
a second current mirror circuit which provides the output current of the second differential pair to the first node;
a third current mirror circuit which transmits a current provided to the first node to the output node;
a fourth current mirror circuit which multiplies the output current of the second differential pair by K and provides a current generated by multiplying the output current of the second differential pair by K to the second node;
a fifth current mirror circuit which provides the output current of the first differential pair to the second node; and
a sixth current mirror circuit which transmits a current which is provided to the second node to the output node.

13. The display panel of claim 11, wherein the differential input terminal further comprises:
a third differential pair; and
a fourth differential pair,
wherein the amplifier further comprises:
a seventh current mirror circuit which multiplies an output current of the third differential pair by K1 where K1 is a positive real number, and transmits a current generated by multiplying the output current of the third differential pair by K1 to a first node; and
an eighth current mirror circuit which multiplies an output current of the fourth differential pair by K1 and transmits a current generated by multiplying the output current of the fourth differential pair by K1 to a second node.

14. The display apparatus of claim 11, wherein the current redistributor comprises:
a current provider which provides the redistribution current to the first differential pair and the second differential pair, based on the output current of the first differential pair and the output current of the second differential pair; and
a second power supplier which supplies a bias voltage to the current provider.

15. The display apparatus of claim 14, wherein the current redistributor further comprises:

a ninth current mirror circuit which provides a first switch current to a third node based on the output current of the first differential pair;

a tenth current mirror circuit which provides the redistribution current to the first differential pair;

a first switching element including a control electrode which receives the bias voltage, an output electrode connected to an input electrode of the tenth current mirror circuit, and an input electrode connected to the third node;

an eleventh current mirror circuit which provides a second switch current to the third node, based on the output current of the second differential pair;

a twelfth current mirror circuit which provides the redistribution current to the second differential pair; and a second switching element including a control electrode which receives the bias voltage, an output electrode connected to an input electrode of the twelfth current mirror circuit, and an input electrode connected to the third node, wherein the tenth current mirror circuit provides the redistribution current to the first differential pair, based on a first supply current which flows through the second switching element, and wherein the twelfth current mirror circuit provides the redistribution current to the second differential pair, based on a second supply current which flows through the second switching element.

16. The display apparatus of claim 15, wherein the current redistributor provides the redistribution current to the first differential pair and does not provide the redistribution current to the second differential pair in a first mode, wherein the current redistributor provides the redistribution current to the second differential pair and does not provide the redistribution current to the first differential pair in a second mode, and wherein the current redistributor does not provide the redistribution current to the first differential pair and the second differential pair in a third mode.

17. The display apparatus of claim 16, wherein the first differential pair and the first switching element are turned on in the first mode, wherein the second differential pair and the second switching element are turned off in the first mode, wherein the second differential pair and the second switching element are turned on in the second mode, wherein the first differential pair and the first switching element are turned off in the second mode, wherein the first differential pair and the second differential pair are turned on in the third mode, wherein the first switching element and the second switching element are turned off in the third mode.

18. The display apparatus of claim 17, wherein the input voltage in the first mode is less than the input voltage in the third mode, wherein the input voltage in the third mode is less than the input voltage in the second mode.

19. The display apparatus of claim 15, wherein the bias voltage is less than twice a threshold voltage of the first switching element, and less than twice a threshold voltage of the second switching element.

20. The display apparatus of claim 11 further comprising:
a common source amplifier connected to the output node of the amplifier.

* * * * *